United States Patent
Zhou et al.

(10) Patent No.: US 10,424,528 B2
(45) Date of Patent: Sep. 24, 2019

(54) LAYERED COOLING STRUCTURE INCLUDING INSULATIVE LAYER AND MULTIPLE METALLIZATION LAYERS

(71) Applicant: Toyota Motor Engineering & Manufacturing North America, Inc., Erlanger, KY (US)

(72) Inventors: Feng Zhou, South Lyon, MI (US); Yanghe Liu, Ann Arbor, MI (US); Ercan Mehmet Dede, Ann Arbor, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 0 days.

(21) Appl. No.: 15/890,511

(22) Filed: Feb. 7, 2018

(65) Prior Publication Data
US 2019/0244872 A1  Aug. 8, 2019

(51) Int. Cl.
*H01L 25/18* (2006.01)
*H01L 23/367* (2006.01)
*H01L 25/11* (2006.01)
*F28F 3/02* (2006.01)
*H01L 23/00* (2006.01)

(52) U.S. Cl.
CPC ............ *H01L 23/3675* (2013.01); *F28F 3/02* (2013.01); *H01L 24/06* (2013.01); *H01L 24/10* (2013.01); *H01L 24/36* (2013.01); *H01L 25/115* (2013.01); *H01L 24/32* (2013.01); *H01L 2224/32225* (2013.01); *H01L 2224/32245* (2013.01); *H01L 2924/13055* (2013.01)

(58) Field of Classification Search
CPC ..... H01L 23/3675; H01L 25/15; H01L 24/32; H01L 23/10; H01L 23/34; H01L 23/06; F28F 3/02
See application file for complete search history.

(56) References Cited

U.S. PATENT DOCUMENTS

| | | | |
|---|---|---|---|
| 4,842,699 A | 6/1989 | Hua et al. | |
| 4,979,074 A | 12/1990 | Morley et al. | |
| 5,291,064 A * | 3/1994 | Kurokawa | ............ H01L 23/057 257/706 |

(Continued)

OTHER PUBLICATIONS http://www.conformalcoatinghelp.com/index.php/ebook/production/masking/ (accessed Jun. 30, 2017).

*Primary Examiner* — Ahmed N Sefer
(74) *Attorney, Agent, or Firm* — Christopher G. Darrow; Darrow Mustafa PC (57) ABSTRACT

An assembly includes at least one heat emitting device and a continuous conformal cooling structure adhering directly to and conforming with surfaces of at least a portion of the at least one heat emitting device. The cooling structure may include a thermally-conductive, electrically-insulative layer adhering directly to surfaces of the at least one heat generating device to provide an electrically nonconductive, continuous, conformal layer covering all such surfaces. An inner metallization layer may be adhered directly to surfaces of at least a portion of the insulative layer. An outer metallization layer may be adhered directly to surfaces of the inner metallization layer to provide a thermally conductive layer covering such surfaces.

19 Claims, 5 Drawing Sheets

(56) References Cited

U.S. PATENT DOCUMENTS

| | | | | |
|---|---|---|---|---|
| 5,606,201 | A | * | 2/1997 | Lutz ........................ F28F 13/02 |
| | | | | 257/714 |
| 6,849,800 | B2 | | 2/2005 | Mazurkiewicz |
| 10,002,844 | B1 | * | 6/2018 | Wang ...................... H01L 24/29 |
| 2010/0117209 | A1 | * | 5/2010 | Bezama ................ H01L 23/427 |
| | | | | 257/686 |
| 2013/0214396 | A1 | * | 8/2013 | Kim ...................... H01L 23/552 |
| | | | | 257/659 |
| 2015/0021755 | A1 | * | 1/2015 | Hsiao .................. H01L 25/0657 |
| | | | | 257/714 |
| 2015/0230352 | A1 | * | 8/2015 | Hashikura ................ H02G 3/08 |
| | | | | 174/547 |
| 2015/0279431 | A1 | * | 10/2015 | Li ........................... H01L 25/50 |
| | | | | 365/51 |
| 2016/0013115 | A1 | * | 1/2016 | Vadhavkar .......... H01L 25/0657 |
| | | | | 257/713 |
| 2016/0343639 | A1 | * | 11/2016 | Groothuis ............. F28D 15/043 |
| 2017/0154837 | A1 | * | 6/2017 | Sasaki ................. H01L 23/3736 |
| 2018/0166351 | A1 | * | 6/2018 | Han ........................ H01L 23/10 |

\* cited by examiner

LAYERED COOLING STRUCTURE INCLUDING INSULATIVE LAYER AND MULTIPLE METALLIZATION LAYERS

TECHNICAL FIELD

The present invention relates to structures for cooling heat emitting devices (for example, in the form of high power density power electronic components, such as an Insulated Gate Bipolar Transistor (IGBT)) mounted on a substrate such as a copper substrate or a circuit board.

BACKGROUND

A heat generating device such as a semiconductor device may be mounted to a substrate using soldering or another attachment method. During operation of the heat generating device, it is desirable to remove generated heat from the device and the substrate to prevent damage to the components due to elevated temperatures. Existing cooling arrangements may receive and remove heat from the heat generating device only along a top-most surface of the device. These arrangements may also may receive and remove heat from the substrate only along a bottom-most surface of the substrate. In conventional packaging arrangements configured for heat removal, relatively thick, separately formed and stacked layers comprising various structures such as insulation, spacers and heat spreaders may dramatically increase the bulk of the resulting assembly and the thermal resistance between the heat generating device and a coolant medium, thereby decreasing heat transfer efficiency.

SUMMARY

In one aspect of the embodiments described herein, an assembly is provided including at least one heat emitting device and a continuous conformal cooling structure adhering directly to and conforming with surfaces of at least a portion of the at least one heat emitting device. The cooling structure may include a thermally-conductive, electrically-insulative layer adhering directly to surfaces of the at least one heat generating device to provide an electrically nonconductive, continuous, conformal layer covering all such surfaces. An inner metallization layer may be adhered directly to surfaces of at least a portion of the insulative layer. An outer metallization layer may be adhered directly to surfaces of the inner metallization layer to provide a thermally conductive layer covering such surfaces.

In another aspect of the embodiments described herein, an assembly is provided including at least one heat emitting device physically attached to a substrate. At least a portion of the at least one heat emitting device is positioned along a first side of the substrate. A continuous conformal cooling structure is also provided, including a thermally-conductive, electrically-insulative layer extending from the first side of the substrate to completely cover the at least a portion of the heat emitting device positioned along the side of the substrate. The insulative layer may adhere directly to surfaces of the at least one heat emitting device to provide an electrically nonconductive, continuous, conformal layer covering the at least a portion of the at least one heat emitting device. An inner metallization layer may be adhered directly to surfaces of at least a portion of the insulative layer directly opposite a location where the at least one heat emitting device is physically attached to the substrate. An outer metallization layer may be adhered directly to surfaces of the inner metallization layer to provide a thermally conductive layer covering such surfaces.

DETAILED DESCRIPTION

Embodiments described herein relate to an assembly incorporating at least one heat emitting device and a continuous conformal cooling structure adhering directly to and conforming with surfaces of at least a portion of the heat emitting device(s), the heat emitting device(s) may be, for example, a semiconductor chip and a substrate on which the chip is mounted. The cooling structure may include a thermally-conductive, electrically-insulative layer adhering directly to surfaces of the heat generating device(s) to provide an electrically nonconductive, continuous, conformal layer covering all such surfaces. The insulative layer may be formed by a dielectric coating applied to completely cover the heat emitting device(s). An inner metallization layer may be adhered directly to surfaces of at least a portion of the insulative layer. An outer metallization layer may be adhered directly to surfaces of the inner metallization layer to provide a thermally conductive layer covering such surfaces. The cooling structure facilitates transfer of heat from the heat emitting device(s) while protecting the device(s) from moisture and contaminants.

With regard to the various embodiments described herein, elements or types of elements common to multiple embodiments may have similar reference numerals in the drawings. Thus, for example, reference numeral "36" is used in FIGS. 1A and 1B to designate an insulative layer, while reference numeral "236" is used in FIG. 2 to designate the insulative layer.

Figure 1A:
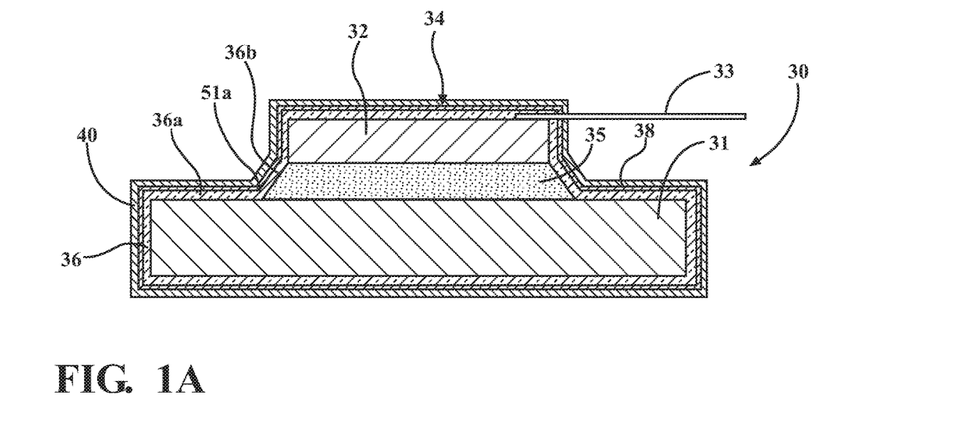
FIG. 1A is a schematic cross-sectional view of an assembly incorporating a layered cooling structure in accordance with an embodiment described herein, shown completely immersed in a liquid coolant medium.
Figure 1B:
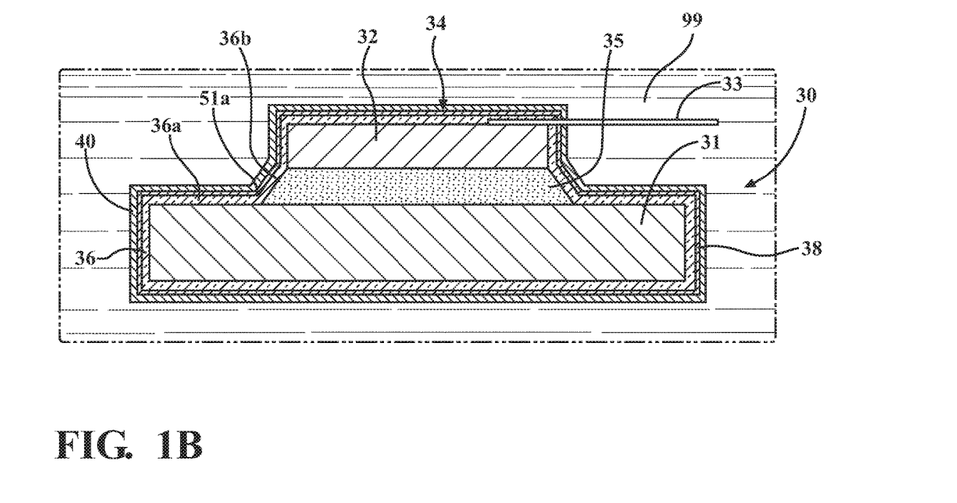
FIG. 1B is a schematic cross-sectional view of the assembly of FIG. 1A, showing the heat emitting assembly in an environment where gas cooling may be used with free and/or forced convection.

In one or more arrangements, and as shown in the drawings, an assembly in accordance with the present invention may include a heat emitting device physically attached to a substrate, with at least a portion of the heat emitting device being positioned along a side of the substrate. FIGS. 1A and 1B show cross-sectional side views of a heat emitting assembly 30 in accordance with an embodiment described herein. In the embodiment shown in FIGS. 1A and 1B, the heat emitting assembly includes at least one heat emitting device 32 which is completely covered by one or more layers of a continuous conformal cooling structure (generally designated 34) adhering directly to and conforming with surfaces of at least a portion of the heat emitting device 32. In one or more arrangements, heat emitting device 32 may be attached to a substrate 31 as shown in FIGS. 1A and 1B by a soldered, adhesive, or other type of bonding layer 35.

FIG. 1A shows the heat emitting assembly 30 in an environment where gas cooling may be used (for example, by air or a gaseous coolant medium) with free and/or forced convection, while FIG. 1B shows the heat emitting assembly 30 completely immersed in a liquid coolant medium 99. Surfaces covered by the cooling structure 34 may be, for example, the tops, sides and, if exposed, bottom surfaces of any heat emitting device(s), the surfaces of any leads, wires, etc, that are connected to the heat emitting device, as well as any other exposed surface of any other portions, elements, sections or features (hereinafter "features") of the device(s). Thus, the cooling structure 34 may completely encapsulate, cover or enclose the heat emitting device(s) 32, substrate 31, and other connected components except for portions 33 of the heat emitting device(s) 32 (such as any connecting leads or terminals, for example) extending from the emitting device(s), substrate, and other connected components and through the layers of the cooling structure to permit electrical or other connection to elements external to the assembly 30. This structure enables heat to be transferred in all directions to a coolant medium from any heat emitting device enclosed within the cooling structure. Heat emitting device(s) 32 may be a through-hole or surface mount component. Thus, leads, terminals, or other structures 33 may or may not extend through the substrate 31 as required. Leads, terminals, or other structures 33 for electrical and/or mechanical connection may extend from through the substrate as shown or through any other portion of the cooling structure for attachment to elements exterior of the assembly 30 as needed. Such structures may have any required length(s).

The cooling structure 34 may include a thermally-conductive, electrically insulative layer 36 adhering directly to exposed surfaces of the heat emitting device 32 to provide an electrically nonconductive, continuous, conformal layer covering all such surfaces. An inner metallization layer 38 may be adhered directly to surfaces of at least a portion of the electrically insulative layer 36. An outer metallization layer 40 may be adhered directly to surfaces of the inner metallization layer 38 to provide a continuous, thermally conductive layer covering all such surfaces.

It should be appreciated that selection of the combination of material properties for insulative layer 36 and metallization layers 38 and 40 may be important to achieving a conformal cooling structure 34 that can be applied directly to exposed surfaces of any heat emitting devices incorporated into assembly 30 without damaging components and connections, that does not expose the enclosed regions to risk of electrical shorts, and that completely envelops or encases the enclosed regions to provide a cooling structure configured to facilitate heat transfer away from the heat emitting device(s).

The heat emitting device 32 may be any device which generates and/or receives heat during its operation, and from which it is necessary or advisable to transfer heat to the device surroundings. This may include devices such as electrical components which generate heat during operation, and devices such as printed circuit boards (PCB's) or other substrates which may receive heat from heat-generating components and which may transmit the received heat via convection, conduction, or radiation. Numerous other types of devices may also be used.

Figure 4:
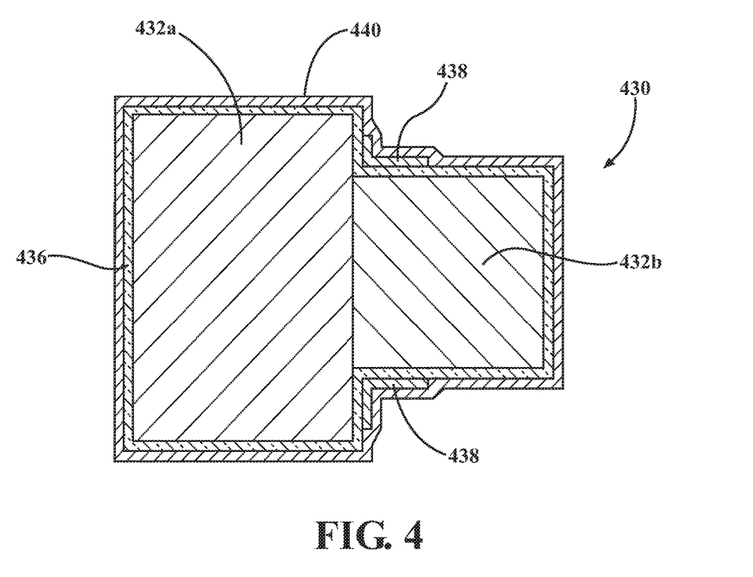
FIG. 4 is a schematic cross-sectional view of an assembly incorporating a layered cooling structure in accordance with another embodiment described herein.

A heat emitting device 32 of the assembly 30 may be a heat-generating component (for example, a semiconductor component or an individual surface-mount component), or the heat emitting device may be an element which absorbs or receives heat from another, heat generating component during operation of the heat generating component. For example, the heat emitting device may be a heat-generating electronic component soldered or otherwise bonded to a substrate (such as a PCB or copper substrate, for example). One example of such an assembly is shown in FIGS. 1A and 1B, where substrate 31 is a heat receiving component (which may be a PCB, copper or other substrate, or device which is thermally connected to a heat generating component such as semiconductor device by a soldered connection) receives heat generated by a heat generating component (device 32) in thermal communication with the heat receiving component. The assembly 30 may also be formed from two or more heat emitting devices physically connected to each other such as shown in FIG. 4, for example. One or more of the devices 432a and 432b may be a heat generating component.

Leads, terminals, contacts and/or other means of electrically connecting the assembly 30 to another component may extend from the heat emitting device(s) and through the dielectric, inner metallization, and outer metallization layers. A heat emitting device may also be simply bonded to the substrate or another heat-emitting device, with no features extending from the heat emitting device(s) through the layers of the cooling structure. Connections and/or communications between the device(s) and another component may also be wireless.

In embodiments described herein, the insulative layer may be continuous (i.e., the insulative layer may completely cover the heat emitting device(s) and may be uninterrupted except where a connecting or attachment structure extends from a heat emitting device for connection or attachment to an elements exterior of the assembly).

In one or more arrangements, and as shown in FIGS. 1A and 1B for example, insulative layer 36 is structured to completely cover the heat emitting device(s) so as to prevent physical contact between the covered portions of the heat emitting device(s) and a coolant medium surrounding the assembly. Also, a portion of the insulative layer may extend from the side of the substrate to completely cover the at least a portion of the heat emitting device positioned along the side of the substrate.

In one or more arrangements, an insulative layer as described herein is formed from a material that is electrically nonconductive, has a relatively high thermal conductivity, and has a relatively high dielectric strength. Another desirable material property of the material forming insulative layer is an ability to penetrate cavities and spaces in and between the heat emitting device(s) of the assembly. Thus, the material used for the insulative layer may have a combination of viscosity and adhesion sufficient to enable insulative layer 36 to be applied (for example, coated or plated) onto a heat emitting device using suitable techniques, such as vacuum deposition polymerization or plasma-enhanced chemical vapor deposition (PECVD), for example, so as to prevent the formation of voids or gaps in the dielectric coating. This may enable the insulative layer to completely access and coat the surfaces of the heat emitting devices and/or substrates that are located underneath heat emitting device leads, between heat emitting devices, and on any wiring board surfaces and other regions that are exposed yet difficult to access. Such features of the heat emitting devices and/or substrates are referred to generally herein as cavities.

Other desirable material properties of the insulative layer embodiments described herein include an ability to withstand high temperatures and an ability of the material to securely adhere to surfaces of one or more heat-emitting device(s) in the immediate vicinity to which it is applied. In other words, adhesiveness of the insulative layer is sufficient to prevent the insulative layer from separating from the surface of a heat emitting device to which it is applied during use of the heat emitting device and cooling of the heat emitting device. It is also desirable that the insulative layer serve as a barrier against moisture, dirt, chemicals and/or other potential contaminants to be encountered in a given end use environment.

In one or more particular arrangements, the insulative layer is configured to adhere to the materials utilized in a substrate in the form of a printed circuit board. Such materials may include, but are not limited to, FR-4 such as polymethylmethacrylates, bisphenol-A based epoxy and fiberglass, ceramics such as aluminum oxide an silicon dioxide, silicon, polyimide (silicon wafers), polyethylene (sockets), polyethylene terephtbalate, polystyrene (sockets), polyphenylsulfone or PPS (chip sockets), polyvinyl chloride or PVC (wire coverings), silicone rubbers such as RTV (various surfaces), aluminum, gold, stainless steel and low carbon steel), tin, lead, and others. In one or more arrangements, the insulative layer is structured to withstand temperatures of up to 150° C. over the projected life span of the assembly.

The insulative layer may be specified and applied to the heat emitting device(s) so as to prevent contact between the heat emitting device(s) and a coolant medium when the assembly is exposed to or immersed in the coolant medium. In addition, since the insulative layer may be in direct contact with a coolant medium such as air, water, or a medium including one or more added chemicals, it may be desirable for the insulative layer to be able to withstand long term exposure to a known coolant medium without wearing away or chemically reacting with the coolant medium.

An insulative layer may be formed by multiple, successively applied layers of insulative material. As such, the material forming the insulative layer may also include properties necessary to enable it to adhere to or bond with previously applied layers of insulative material. The thickness of the insulative layer may vary according to such factors as the particular application, the material properties and/or application process used for the insulative layer, end use conditions, and other factors.

In one or more arrangements, an insulative layer as described herein may be in the form of a dielectric coating material. While the following describes an insulative layer in the form of a dielectric coating, it will be understood that the insulative layer may have other forms and may be formed from suitable materials other than the dielectric coating materials described herein.

The dielectric coating can comprise multiple, successively applied layers of dielectric material. As such, dielectric material may also include properties necessary to enable it to adhere to or bond with previously applied dielectric layers. The specific type and details of the process used to apply dielectric coating 36 may depend on such factors as the type of dielectric material used, characteristics (such as materials used and geometry) of the heat emitting device(s) to which the dielectric layer is to be applied, the type of cooling and cooling medium to which a finished assembly will be subjected, and other factors.

The composition and method of application of the dielectric coating may be selected so as to prevent voids or gaps in the finished coating as applied. Voids in the dielectric coating 36 may enable an electrical short in the exposed portion of a heat emitting device in the form of an electrical component, PCB, or other substrate, for example. Such a void or surface defect may also permit coolant medium to contact a substrate or heat emitting device which is otherwise covered by the dielectric coating, possibly damaging the device or further damaging the dielectric coating 36.

In one or more arrangements, the conformal dielectric coating is formed from parylene. As is known in the pertinent art, parylene is a generic name for members of a specific type of polymer. Parylene may adhere strongly to a wide variety of materials, including stainless steel, and makes an excellent barrier material. Known adhesion-promotion techniques may be used to increase adhesion of the coating to particular materials. Variants of parylene also have a strong resistance to elevated temperatures.

In one or more particular arrangements, a variant of parylene known as Parylene N may be employed as the dielectric layer. Parylene N has a relatively high dielectric strength and is able to penetrate cavities in and between the heat emitting device(s) of the assembly very effectively.

As is known in the pertinent art, parylene may be deposited on surfaces of a heat emitting device using known chemical vapor deposition procedures. When heated, parylene transforms into a gaseous state. It is then introduced to a vacuum chamber where it polymerizes and becomes a film, which is deposited on the heat emitting device. Many vendors are available for providing parylene coating formulations, equipment, and technical assistance. For example, one such vendor is Para Tech Coating of Aliso Viejo, Calif.

In one or more arrangements, the conformal dielectric coating is formed from silicon dioxide or a compound containing silicon dioxide. As is known in the pertinent art, silicon dioxide thin film coatings may be applied to surfaces using plasma enhanced chemical vapor deposition (PECVD) technology. One vendor providing silicon dioxide coating formulations, equipment, and technical assistance is General Plasma Inc. of Tucson, Ariz.

Other materials suitable for use in an insulative layer 36 include compositions formed from (or containing) polymers, ceramics and/or other similar materials which are thermally conductive, electrically insulative, and which may include the other desirable properties described above.

In one or more arrangements, the insulative layer may have a thickness in the range 0.1-30 microns inclusive, depending on dielectric strength of the selected insulative material. For example, where a polymeric insulative material (for example, a parylene) is used, the thickness of the insulative layer may range from about 20 microns to about 30 microns inclusive because the dielectric strength of a polymeric dielectric coating may be relatively low. In another example, where an insulative material incorporating silicon dioxide is used, the thickness of the insulative layer may range, for example, from about 0.1 micron to about 1.0 micron inclusive due to the relatively greater dielectric strength of silicon dioxide coatings and insulative materials.

In certain applications there may be surfaces on a heat emitting device that are more difficult to adhere to despite dielectric coating having a combination of the properties noted above. For example, cavities and very sharp or pointed surfaces provide less opportunity for a material to adhere to the defining surfaces. In such applications, a conservative approach may be taken with regard to coverage since incomplete coverage of the heat emitting device can lead to an electrical short circuit when a metallization layer is applied over the dielectric coating. Accordingly, in such applications, dielectric coating can be applied in multiple applications, each resulting in a layer of dielectric material coating the covered region of the associated heat emitting device(s). For example, a dielectric coating may be applied in two applications of approximately 1 microns each, for a total thickness of approximately 2 microns. Each layer may be applied with multiple cross coats, with a delay or pause between the first and second applications of approximately 1 to 2 minutes to allow the layer just applied to set up before the next layer is applied.

In embodiments described herein, an inner metallization layer may be adhered directly to exterior surfaces of at least a portion of the insulative layer. Thus, the inner metallization layer will reside between the insulative layer and the outer metallization layer. The inner metallization layer may act as a stress relief buffer layer between the insulative layer and the outer metallization layer. The inner metallization layer may be formed from a thermally-conductive metal or metal alloy.

In one or more arrangements, the inner metallization layer may be applied conformally to the insulative layer at locations where relatively high stresses may be generated between the insulative layer and the outer metallization layer during heating of elements of the assembly. The inner metallization layer may be applied selectively to these locations. Thus, the selected areas of application of inner metallization layer may depend on the anticipated thermal expansion of each component of the assembly.

These elevated stress regions may be due to differences in the coefficients of thermal expansion (CTE) of the insulative and the outer metallization layers. For example, a material (such as silicon dioxide, for example) forming the insulative layer may have a relatively low CTE, while a material (such as copper, for example) forming the outer metallization layer may have a relatively higher CTE. Thus, when heated, the insulative layer and the outer metallization layer may expand at different rates. In addition, heating and thermal expansion of the heat emitting devices covered by the insulative and outer metallization layers may contribute to the stretching or expansion of the layers, thereby introducing an additional, mechanical component into the stress regime. Such differential expansion may stress the adhesion bonds between the insulative layer and the outer metallization layer, producing voids or gaps between the layers. The differential expansion and resulting stresses may also lead to cracking of one or more of the layers.

Interposing of a thermally-conductive inner metallization layer formed form a relatively ductile metal between the insulative layer and the outer metallization layer may aid in relieving stresses due to differential thermal expansion. By adhering to both the insulative layer and the outer metallization layer, the portions of the inner metallization layer adjacent the insulative layer and the outer metallization layer may deform locally responsive to the expansion of the associated insulative layer and outer metallization layer.

In one method of selectively applying the inner metallization layer, the insulative layer may be applied to the heat emitting device and substrate. A mask layer may then be applied to locations on the insulative layer where the inner metallization layer is not desired. Next, the inner metallization layer may be deposited onto the insulative layer and onto the masking layer such that when the masking layer is removed, only the remaining inner metallization layer is positioned at the desired locations.

Examples of regions where the inner metallization layer may be selectively applied to the insulative layer include "corner" regions formed by intersections between exterior surfaces of the insulative layer. Such corner regions of the insulative layer may be located opposite regions where two separate parts or devices of the assembly 30 intersect or approach closest to each other or are in physical contact, for example. For example, as shown in FIG. 1A, at least one intersection 51a may be formed between a first exterior surface 36a of the insulative layer 36 and a second exterior surface 36b of the insulative layer. The corner or intersection 51a may be in the form of a contour line extending along at least a portion of the insulative layer 36. Such intersections may produce discontinuities in the surfaces of the cooling structure layers covering the devices. Also, different parts or devices may thermally expand at different rates when heated, further exacerbating the stresses experienced by the cooling structure layers in such regions. At such intersections, the inner metallization layer may be applied to conformally cover the intersection and also portions of the first and second exterior surfaces (for example, surfaces 36a and 36b of FIGS. 1A, 1B) of the insulative layer adjacent the intersection.

In one or more arrangements, in an embodiment where the inner metallization layer covers the intersections just described and also extends beyond such intersections to cover additional portions of the insulative layer, the thicknesses of the portions of the inner metallization layer covering the intersections may be relatively greater than the thicknesses of other portions of the inner metallization layer. Increasing the thickness of the inner metallization layer at these locations may increase the stress-reduction capability of the inner metallization layer in such regions of relatively higher thermal and mechanical stresses.

An inner metallization layer as described herein may be formed form any metal which has a relatively high ductility and which may be plated or otherwise deposited in the desired locations at desired thickness(es) to conformally cover the specific surfaces as desired, depending on the particular application. It is also desirable to select an inner metallization layer material which exhibits a strong adhesion to the material forming the insulative layer, and to which the outer metallization layer material will strongly adhere. Thus, due to the possible interdependence of the various layers, it may be desirable to select the materials for the insulative, outer metallization, and inner metallization layers using a "system" approach.

Examples of suitable materials for the inner metallization layer in most applications are copper, titanium, and gold. However, any of a variety of other materials may be used. The inner metallization layer may be plated, coated, or otherwise applied to the insulative layer using vapor deposition, sputter deposition, or any other suitable process. In one or more arrangements, the inner metallization layer is formed form a different material than an associated outer metallization layer. In one or more arrangements, the inner metallization layer may have a thickness in the range 0.1-1.0 microns inclusive. Depending on the material used, the inner metallization layer may be relatively expensive. However, the functions of the inner metallization layer may be performed by a layer which is relatively thin if a suitable material is selected. Numerous vendors are available for providing metallized coating formulations, equipment, and technical assistance. For example, one such vendor is A & A Coatings of South Plainfield, N.J.

In one or more arrangements, due to the especially strong adhesion achievable between titanium and gold, the outer metallization layer may be formed from titanium and the inner metallization layer may be formed from gold. As seen in FIGS. 1A and 1B, for example, the outer metallization layer may completely enclose the heat emitting device(s), the inner metallization layer, and the insulative layer. The outer metallization layer may be formed from a thermally-conductive metal or metal alloy.

Figure 5:
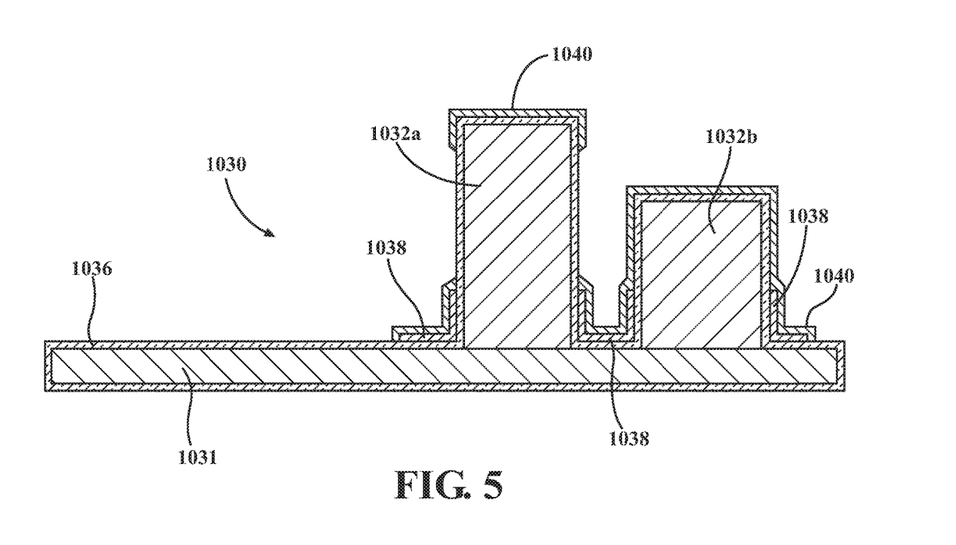
FIG. 5 is a schematic cross-sectional view of an assembly similar to that shown in FIG. 3, incorporating a layered cooling structure in accordance with yet another embodiment described herein.

In one or more arrangements, at least a portion of the outer metallization layer is selectively adhered directly to a portion of an associated insulative layer not covered by an inner metallization layer. One example of such an arrangement is shown in FIG. 5, which shows portions of an outer metallization layer 1040 covering upper surfaces of two heat emitting devices 1032a and 1032b. The enhanced thermal conductivity of the outer metallization layer may enable an increased or optimized rate of cooling for selected portions of the heat emitting elements to which the portions of the outer metallization layer are selectively applied.

For example, the insulative layer and inner metallization layer may be applied to the heat emitting device and substrate. A mask layer may then be applied to locations on the insulative layer where the outer metallization layer is not desired. Next, the outer metallization layer may be deposited onto the insulative layer, inner metallization layer, and the masking layer such that when the masking layer is removed the remaining outer metallization layer is positioned at the desired locations on the insulative layer.

It is desirable that the outer metallization layer be structured to protect the layers it covers and also the heat emitting devices and other covered elements of the assembly from moisture, contaminants, and other substances that may damage the assembly of impede its operation. In one or more arrangements, the outer metallization layer may have a thickness in the range 10 microns-50 microns, inclusive. The outer metallization layer may be plated, coated, or otherwise applied to the inner metallization layer using vapor deposition, sputter deposition, or any other suitable process.

Figure 6:
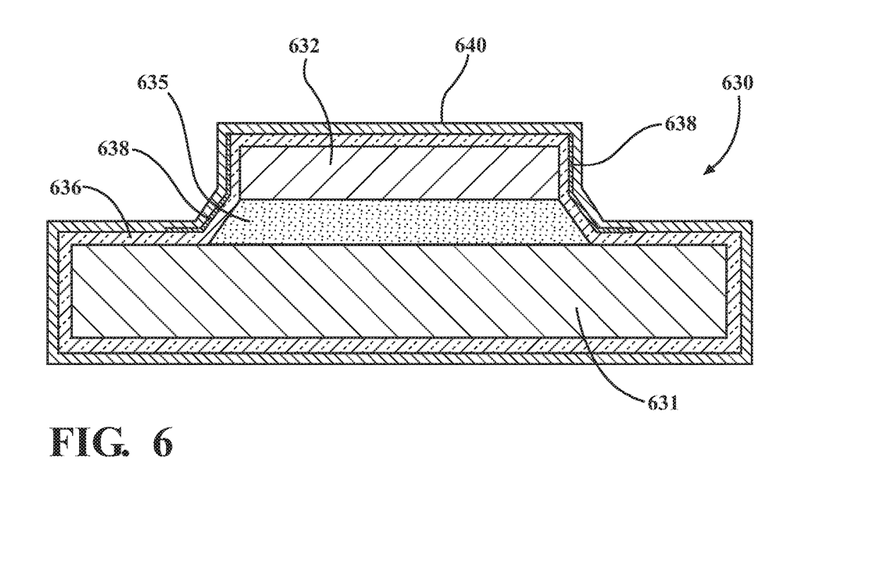
FIG. 6 is a schematic cross-sectional view of an assembly similar to that shown in FIGS. 1A and 1B, incorporating a layered cooling structure in accordance with yet another embodiment described herein.

In one or more arrangements, as seen in FIGS. 1A, 1B, 2, 4, and 6 for example, the outer metallization layer is adhered directly to any surfaces of the insulative layer not adhered to by the inner metallization layer. In one or more arrangements, as seen in FIG. 6 for example, the outer metallization layer is adhered directly to any surfaces of the inner metallization layer not in direct contact with the insulative layer, so as to completely cover all such surfaces.

In one or more arrangements, and as shown in FIGS. 1A, 1B, 2, 6, and 7 for example, an assembly in accordance with the present invention may include a heat emitting device physically attached to a substrate, with at least a portion of the heat emitting device being positioned along a side of the substrate. Also, a portion of the insulative layer may extend from the side of the substrate to completely cover the at least a portion of the heat emitting device positioned along the side of the substrate. For example, referring to the particular embodiment shown in FIG. 2, one or more heat emitting devices 232a and 232b are physically attached to a substrate 231, with at least portion of each heat emitting device being positioned along a first side 231a of the substrate 231. Also, a portion of the insulative layer 236 extends from the first side 231a of the substrate 231 to completely cover the portions of the heat emitting devices 232a and 232b positioned along the first side 231a of the substrate 231. In addition, the portions of the insulative layer 236 extending from the substrate 231 to completely cover the portions of the heat emitting devices positioned along the side of the substrate 231 may be at least partially covered by the outer metallization layer 240.

Figure 2:
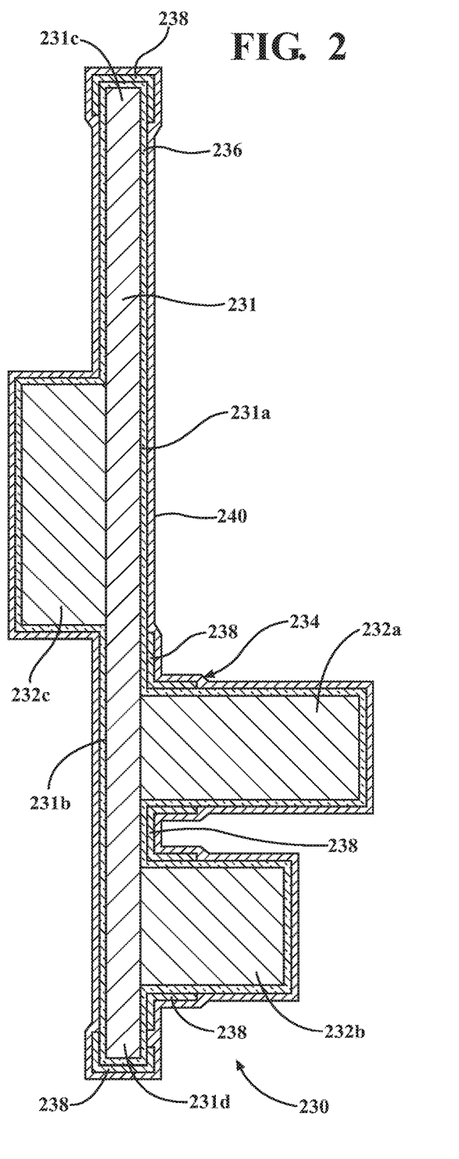
FIG. 2 is a schematic cross-sectional view of an assembly incorporating a layered cooling structure in accordance with another embodiment described herein, where the assembly includes multiple heat emitting devices mounted on a substrate.

In particular embodiments, and as seen in the particular embodiment shown in FIG. 2, the portions of the insulative layer 236 extending from the substrate 231 to completely cover the portions of the heat emitting devices 232a and 232b positioned along the first side 231a of the substrate may be completely covered by the outer metallization layer 240.

Figure 7:
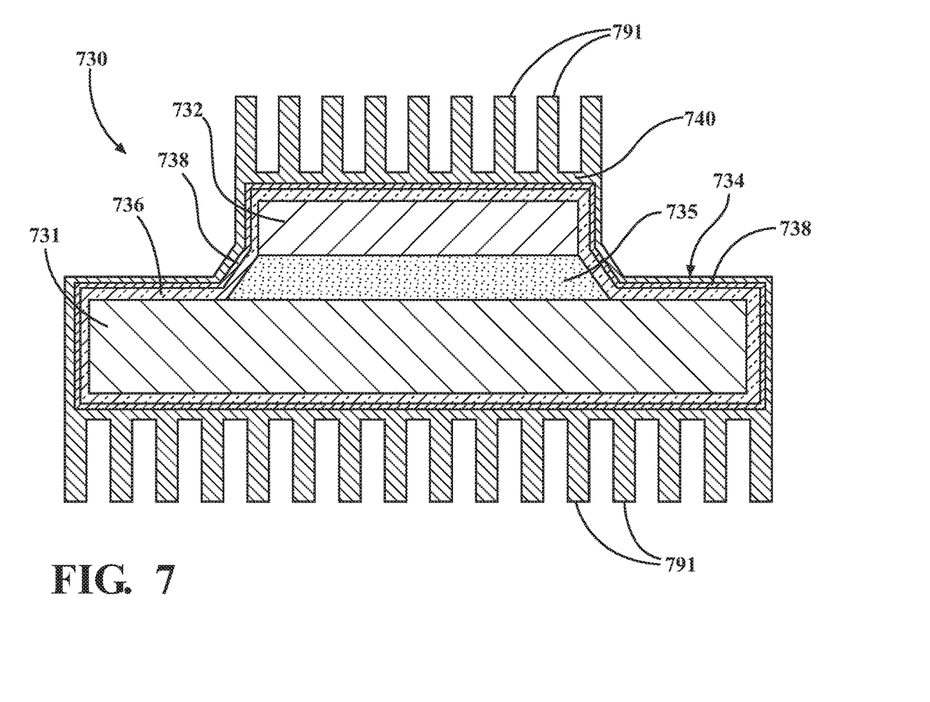
FIG. 7 is a schematic cross-sectional view of an assembly incorporating a layered conformal cooling structure in accordance with another embodiment described herein.

FIG. 7 is a schematic cross-sectional view of an assembly 730 incorporating a layered conformal cooling structure 734 in accordance with another embodiment described herein. The embodiment shown in FIG. 7 is similar to the embodiment shown in FIGS. 1A and 1B. Assembly 730 includes a heat emitting device 732 bonded to a substrate 731 and an insulative layer 736 completely covering the substrate 731 and device 732. An inner metallization layer 738 may be applied to the insulative layer 736 to completely cover the insulative layer 736. An outer metallization layer 740 may be applied to the inner metallization layer 738 to completely cover the inner metallization layer 738.

In one or more arrangements, and as shown in FIG. 7, for example, one or more fins (such as fins 791) may extend from an outer metallization layer (such as outer metallization layer 740) so as to facilitate heat transfer from the outer metallization layer to the fin(s). The fin(s) may be in intimate thermal contact with the outer metallization layer. In one or more arrangements, the fin(s) may be fabricated separately from the outer metallization layer using suitable process(es) and material(s) (for example, 3-D printing). The fin(s) may then be bonded or otherwise suitably attached to an outer surface of the outer metallization layer, using an attachment technique which facilitates heat transfer between the outer metallization layer and the fin(s).

The fin(s) may be formed from the same thermally-conductive material as the outer metallization layer or from a different thermally-conductive material. For example, the fin(s) may be formed from aluminum, nickel, copper, titanium, or any other suitable material. Alternatively, the fin(s) may be formed integrally with the outer metallization layer by, for example, forming a conformal portion of the outer metallization layer covering the inner metallization layer and the insulative layer, then masking portions of the outer metallization layer prior to application of successive layers of outer metallization layer material to gradually build up the fin(s). The fin(s) may be plated, coated, or otherwise applied to the outer metallization layer using vapor deposition, sputter deposition, or any other suitable process.

In one or more arrangements, and as shown in FIGS. 1A, 1B, 2, 6, 7, and 9 for example, an assembly in accordance with the present invention may include a heat emitting device physically attached to a substrate, with at least a portion of the heat emitting device being positioned along a first side of the substrate. Also, a portion of the insulative layer may extend from the first side of the substrate to completely cover the at least a portion of the heat emitting device positioned along the side of the substrate.

For example, FIG. 2 is a schematic cross-sectional view of an assembly 230 incorporating a layered conformal cooling structure 234 in accordance with another embodiment described herein. Referring to the particular embodiment shown in FIG. 2, heat emitting devices 232a, 232b are physically attached to a first side 231a of substrate 231, with at least a portion of each of the heat emitting devices 232a, 232b being positioned along the first side 231a of the substrate 231. An insulative layer 236 is applied to the heat emitting devices 232a, 232b, 232c to completely cover the heat emitting devices and the substrate 231.

In addition, a portion of the insulative layer 236 extends from the first side 231a of the substrate 231 to completely cover the portions of the heat emitting devices 232a, 232b positioned along the first side 231a of the substrate 231. The heat emitting devices 232a, 232b may or may not have leads or other connecting elements (not shown in FIG. 2) which may extend through the substrate to a second side 231b of the substrate 231 opposite first side 231a. Also, the portion of the insulative layer 236 extending from the substrate to completely cover the portions of the heat emitting devices may be is at least partially covered by the inner metallization layer 238. In the embodiment shown, inner metallization layer 238 is selectively applied to the insulative layer 236 at and proximate intersections between the heat emitting devices 232a, 232b and the substrate 231, as described herein. An outer metallization layer 240 may be applied to the inner metallization layer 238 and insulative layer 236 to completely cover the inner metallization layer 238 and insulative layer 236.

Referring again to FIG. 2, in one or more arrangements, at least a portion of at least one additional heat emitting device 232c may be attached to the substrate 231 along the second side 231b of the substrate opposite the first side 231a. Also, a portion of the insulative layer 236 may extend from the second side 231b of the substrate 231 to completely cover the portion of the heat emitting device 232c positioned along the second side 231b of the substrate.

FIG. 6 shows an example of an assembly 630 similar to the assembly shown in FIGS. 1A and 1B. Assembly 630 includes a heat emitting device 632 bonded or otherwise attached to a substrate 631. An insulative layer 636 completely covers the heat emitting device 632 and substrate 631. An inner metallization layer 638 is selectively applied to the insulative layer 636 along intersections between the substrate 631 and the heat emitting device 632. In embodiments of the assemblies described herein where the means of bonding the heat emitting device to the substrate produces a relatively thicker bonding layer (such as bonding layer 635 in FIG. 6 and bonding layer 35 in FIGS. 1A and 1B), the inner metallization layer may also extend continuously along the portion of the insulative layer covering the bonding layer, as well as along the portions of the insulative layer covering the heat emitting device and the substrate. In FIG. 6, an outer metallization layer 640 also completely covers the insulative layer 636 and the inner metallization layer 638.

In another example, FIG. 4 shows a pair of heat emitting devices 432a and 432b physically connected to each other. Referring to FIG. 4, heat emitting device 432a may be a first heat generating device and heat emitting device 432b may be a second heat generating device connected to the first heat generating device. One or more heat emitting devices 432a and 432b may be heat generating devices. In this embodiment, the insulative layer 436 may be applied to completely cover or encapsulate the first and second heat generating devices. In addition, the inner metallization layer 438 may be applied at intersections between the first and second heat generating devices, as previously described, and the outer metallization layer 440 may also be applied to completely cover or encapsulate both the inner metallization layer 438 and the insulative layer 436. The inner metallization layer 438 may help relieve stresses occurring at the intersection between the first and second heat generating devices due to differential thermal expansion, in the manner described herein. Stated another way, the inner metallization layer 438 may be applied along surfaces of the insulative layer 436 opposite a heat emitting device (such as device 432a, for example) and also opposite another element (such as 432b) with which the heat emitting device is in physical contact. This inner metallization layer 438 also resides adjacent a location where the surfaces of the heat emitting device and the other device are in physical contact.

Another example of a region where the inner metallization layer may be selectively applied to the insulative layer is shown in FIG. 2, where inner metallization layer 238 may be applied to end portions 231c and 231d of the substrate 231. Stretching of the inner and outer metallization layers 238 and 240 due to thermal expansion and expansion of the substrate may be most severe at the ends of long sections or dimensions of the substrate. The inner metallization layer 238 may be selectively applied to cover the substrate 231 along these regions to aid in mitigating the effects of the stresses.

Alternatively, for certain applications or assemblies, an inner metallization layer as described herein may be applied to cover the entire insulative layer, between the insulative layer and the outer metallization layer. In addition, along portions of an assembly where the difference between the amount of thermal expansion of the insulative layer and the amount of thermal expansion of the outer metallization layer may be relatively larger, the portion of the inner metallization layer covering these portions of the insulative layer and outer metallization layer may be selectively thickened. Thickening the inner metallization layer in such regions may increase its deflectability and stress-relief capability.

Figure 3:
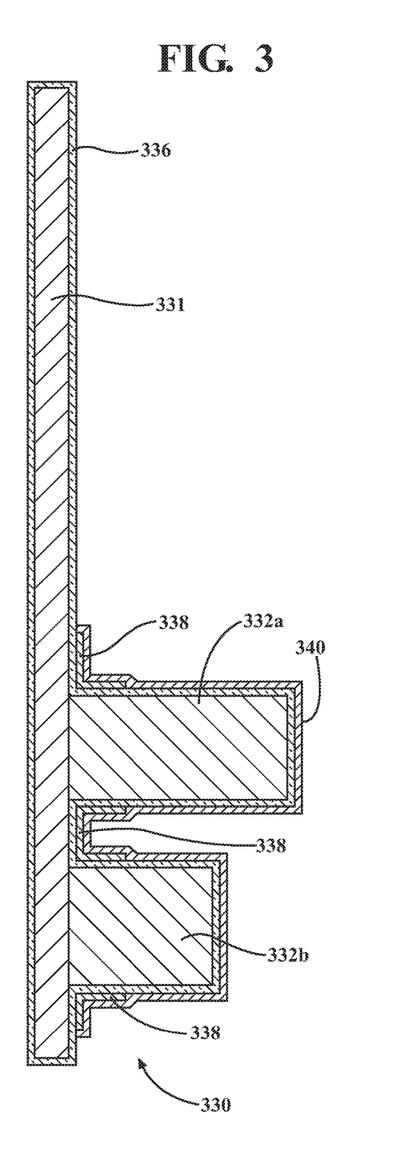
FIG. 3 is a schematic cross-sectional view of an assembly similar to that shown in FIG. 2, and incorporating a layered cooling structure in accordance with yet another embodiment described herein.

FIG. 3 is a schematic cross-sectional view of an assembly similar to that shown in FIG. 2, incorporating a layered cooling structure in accordance with yet another embodiment described herein. In the embodiment shown in FIG. 3, a pair of heat emitting devices 332a and 332b are bonded, soldered, or otherwise attached to substrate 331 along a first side of the substrate. An insulative layer 336 is applied to completely cover the substrate 331 and the heat emitting devices 332a and 332b. An inner metallization layer 338 is selectively applied along and adjacent intersections between the substrate 331 and the heat emitting devices 332a and 332b, as described elsewhere herein. In this embodiment, heat transfer from (and thermal expansion of) the substrate 331 in regions of the substrate spaced apart from the heat emitting devices may be of less concern than heat transfer from other portions of the assembly. Thus, the outer metallization layer 340 may be selectively applied to cover the heat emitting devices 332a and 332b and the inner metallization layer 338.

FIG. 5 is a schematic cross-sectional view of an assembly similar to that shown in FIG. 3, incorporating a layered cooling structure in accordance with yet another embodiment described herein. In the embodiment shown in FIG. 5, a pair of heat emitting devices 1032a and 1032b are bonded, soldered, or otherwise attached to substrate 1031 along a first side of the substrate. An insulative layer 1036 is applied to completely cover the substrate 1031 and the heat emitting devices 1032a and 1032b. An inner metallization layer 1038 is selectively applied along and adjacent intersections between the substrate 1031 and the heat emitting devices 1032a and 1032b as described elsewhere herein, to aid in mitigating stresses on the cooling structure due to differential coefficients of thermal expansion.

In this embodiment, heat transfer from (and thermal expansion of) the substrate 331 in regions of the substrate spaced apart from the heat emitting devices may be of less concern than heat transfer from other portions of the assembly. Also, in this embodiment, it is desired to further facilitate or further enhance heat transfer from an upper portion of the heat emitting device 1032a. Thus, the outer metallization layer 1040 may be selectively applied to cover the inner metallization layer 1038 and insulative layer 1036 along and proximate the intersections, and may also be selectively applied to an upper portion of the heat emitting device 1032a.

Figure 8:
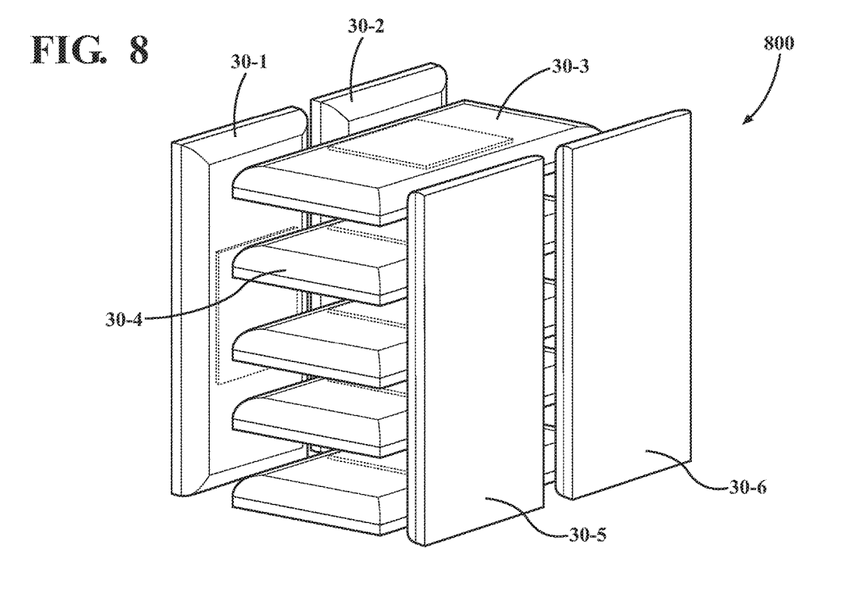
FIG. 8 is a schematic perspective view of an immersive cooling arrangement incorporating multiple assemblies in accordance with the embodiments described herein.
Figure 9:
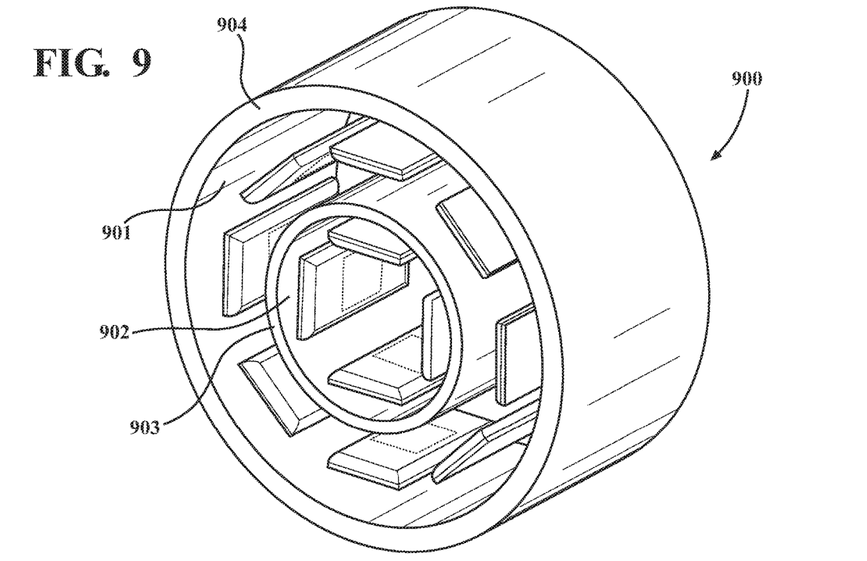
FIG. 9 is a schematic perspective view of another immersive cooling arrangement incorporating multiple assemblies in accordance with the embodiments described herein.

FIGS. 8 and 9 show embodiments of immersive cooling arrangements incorporating assemblies in accordance with the present invention. For FIGS. 8 and 9, it may be seen that assemblies incorporating an embodiment of the layered conformal cooling structures described herein may be positioned in a compact geometric arrangement which may conserve space. The possible arrangements may also be structured to conform to or accommodate the geometry of a device to which the assemblies are attached or electrically connected, or to fit within an enclosure designed contain or guide a flow of coolant medium, for example. The assemblies may be supported so as to be immersible in a flow of coolant (gaseous or liquid), and arranged to allow a flow of coolant over almost the entire exterior surfaces of the assemblies, for more efficient and effective cooling. This allows heat to be transferred to the coolant along all sides (top, bottom, and sides) of the heat emitting devices.

FIG. 8 shows assemblies 30-1 through 30-6, for example, each assembly having the configuration shown in FIGS. 1A and 1B previously described. The assemblies 30-1 and 30-2 and 30-5 and 30-6 are arranged orthogonally with respect to assemblies 30-3 and 30-4. In addition, the assemblies may be supported so as to be spaced apart from each other and from any surrounding structure in which they may be contained, thereby permitting a flow of coolant over almost the entire exterior surfaces of the assemblies.

FIG. 9 shows an assembly arrangement 900 formed from concentric circular groupings 901, 902 of assemblies having the configuration shown in FIGS. 1A and 1B previously described. Each grouping of assemblies is arranged in a circular formation with the assemblies spaced apart to permit cooling flow through the spaces between the assemblies. Also, the circular groupings 901 and 902 are arranged concentrically and each grouping is surrounded by an associated cylindrical enclosure (903 and 904) which is spaced apart from each grouping it encloses. In addition, each of groupings 901, 902 is spaced apart from any adjacent cylindrical enclosure. This arrangement provides flow paths for a coolant medium along the interiors of the cylindrical enclosures and around the assemblies mounted therein.

It should be understood that the preceding is merely a detailed description of various embodiments of this invention and that numerous changes to the disclosed embodiments can be made in accordance with the disclosure herein without departing from the spirit or scope of the invention. Thus, the disclosure is not to be limited to these embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An assembly comprising:
   at least one heat emitting device; and
   a continuous conformal cooling structure adhering directly to and conforming to surfaces of at least a portion of the at least one heat emitting device, the cooling structure including:
      a thermally-conductive, electrically-insulative layer adhering directly to surfaces of the at least one heat emitting device to provide an electrically nonconductive, continuous, conformal layer covering all such surfaces;
      an inner metallization layer adhered directly to surfaces of at least a portion of the insulative layer; and
      an outer metallization layer adhered directly to surfaces of the inner metallization layer to provide a thermally conductive layer covering such surfaces, wherein the outer metallization layer is exposed directly to an environment exterior of the assembly,
   wherein the at least one heat emitting device is physically attached to a substrate, wherein at least a portion of the heat emitting device is positioned along a first side of the substrate, and wherein a portion of the insulative layer extends from the first side of the substrate to completely cover the at least a portion of the heat emitting device positioned along the first side of the substrate.

2. The assembly of claim 1 wherein the outer metallization layer is also adhered directly to any surfaces of the insulative layer not adhered to by the inner metallization layer.

3. The assembly of claim 1 wherein at least a portion of the outer metallization layer is selectively adhered directly to a portion of the insulative layer not covered by the inner metallization layer.

4. The assembly of claim 1 wherein the insulative layer is structured to completely cover the at least one heat emitting device so as to prevent physical contact between the portions of the at least one heat emitting device covered by the insulative layer, and a coolant medium surrounding the assembly.

5. The assembly of claim 1 wherein the outer metallization layer is formed from a different material than the inner metallization layer.

6. The assembly of claim 1 including a first heat generating device and a second heat generating device connected to the first heat generating device.

7. The assembly of claim 1 wherein the inner metallization layer is formed from at least one of titanium, gold, and copper.

8. The assembly of claim 1 wherein the outer metallization layer is formed from at least one of Aluminum, Copper, Nickel, and Titanium.

9. The assembly of claim 1 wherein at least a portion of at least one additional heat emitting device is attached to the substrate along a second side of the substrate opposite the first side of the substrate, and wherein a portion of the insulative layer extends from the second side of the substrate to completely cover the at least a portion of the heat emitting device positioned along the second side of the substrate.

10. The assembly of claim 1 wherein the portion of the insulative layer extending from the substrate to completely cover the at least a portion of the heat emitting device positioned along the first side of the substrate, is at least partially covered by the inner metallization layer.

11. The assembly of claim 1 wherein the portion of the insulative layer extending from the substrate to completely cover the at least a portion of the heat emitting device positioned along the first side of the substrate, is at least partially covered by the outer metallization layer.

12. The assembly of claim 11 wherein the portion of the insulative layer extending from the substrate to completely cover the at least a portion of the heat emitting device positioned along the first side of the substrate, is completely covered by the outer metallization layer.

13. The assembly of claim 1, wherein the insulative layer has properties that enable it to be applied to a surface of the heat emitting device using vacuum deposition polymerization techniques.

14. The assembly of claim 1, wherein the insulative layer has properties that enable it to be applied to a surface of the heat emitting device using plasma-enhanced chemical vapor deposition techniques.

15. An assembly comprising:
at least one heat emitting device; and
a continuous conformal cooling structure adhering directly to and conforming to surfaces of at least a portion of the at least one heat emitting device, the cooling structure including:
   a thermally-conductive, electrically-insulative layer adhering directly to surfaces of the at least one heat emitting device to provide an electrically nonconductive, continuous, conformal layer covering all such surfaces;
   an inner metallization layer adhered directly to surfaces of at least a portion of the insulative layer; and
   an outer metallization layer adhered directly to surfaces of the inner metallization layer to provide a thermally conductive layer covering such surfaces, wherein the outer metallization layer is exposed directly to an environment exterior of the assembly,
wherein at least one intersection is formed between a first exterior surface of the insulative layer and a second exterior surface of the insulative layer, and wherein the inner metallization layer conformally covers the at least one intersection and portions of the first and second exterior surfaces of the insulative layer adjacent the at least one intersection.

16. An assembly comprising:
at least one heat emitting device; and
a continuous conformal cooling structure adhering directly to and conforming to surfaces of at least a portion of the at least one heat emitting device, the cooling structure including:
   a thermally-conductive, electrically-insulative layer adhering directly to surfaces of the at least one heat emitting device to provide an electrically nonconductive, continuous, conformal layer covering all such surfaces;
   an inner metallization layer adhered directly to surfaces of at least a portion of the insulative layer; and
   an outer metallization layer adhered directly to surfaces of the inner metallization layer to provide a thermally conductive layer covering such surfaces, wherein the outer metallization layer is exposed directly to an environment exterior of the assembly, and
wherein the inner metallization layer is applied along surfaces of the insulative layer opposite the at least one heat emitting device and opposite an element with which the at least one heat emitting device is in physical contact, adjacent a location where the surfaces of the at least one heat emitting device and the element approach closest to each other.

17. An assembly comprising:
at least one heat emitting device; and
a continuous conformal cooling structure adhering directly to and conforming to surfaces of at least a portion of the at least one heat emitting device, the cooling structure including:
   a thermally-conductive, electrically-insulative layer adhering directly to surfaces of the at least one heat emitting device to provide an electrically nonconductive, continuous, conformal layer covering all such surfaces;
   an inner metallization layer adhered directly to surfaces of at least a portion of the insulative layer; and
   an outer metallization layer adhered directly to surfaces of the inner metallization layer to provide a thermally conductive layer covering such surfaces, wherein the outer metallization layer is exposed directly to an environment exterior of the assembly,
wherein the assembly further comprises at least one fin extending from the outer metallization layer, so as to facilitate heat transfer from the outer metallization layer to the at least one fin.

18. The assembly of claim 17 wherein the at least one fin is formed integrally with the outer metallization layer.

19. An assembly comprising:
at least one heat emitting device physically attached to a substrate, at least a portion of the at least one heat emitting device being positioned along a first side of the substrate;
a continuous conformal cooling structure including:
   a thermally-conductive, electrically-insulative layer extending from the first side of the substrate to completely cover the at least a portion of the heat emitting device positioned along the first side of the substrate, the insulative layer adhering directly to surfaces of the at least one heat emitting device to provide an electrically nonconductive, continuous, conformal layer covering the at least a portion of the at least one heat emitting device; and
   an inner metallization layer adhered directly to surfaces of at least a portion of the insulative layer directly opposite a location where the at least one heat emitting device is physically attached to the substrate; and
an outer metallization layer adhered directly to surfaces of the inner metallization layer to provide a thermally conductive layer covering such surfaces.

* * * * *